United States Patent
Peng et al.

(10) Patent No.: US 9,095,086 B2
(45) Date of Patent: Jul. 28, 2015

(54) UNLOADING SYSTEM FOR UNLOADING A CIRCUIT BOARD AUTOMATICALLY

(71) Applicant: Wistron Corporation, New Taipei (TW)

(72) Inventors: Hai-Jun Peng, New Taipei (TW);
Yu-Hsi Lan, New Taipei (TW);
Sui-Kuan Sun, New Taipei (TW);
Chun-Kai Wang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 98 days.

(21) Appl. No.: 14/084,594

(22) Filed: Nov. 19, 2013

(65) Prior Publication Data
US 2014/0271056 A1 Sep. 18, 2014

(30) Foreign Application Priority Data

Mar. 15, 2013 (CN) .......................... 2013 1 0084133

(51) Int. Cl.
*H05K 13/00* (2006.01)
*B65G 17/12* (2006.01)

(52) U.S. Cl.
CPC ............ *H05K 13/0061* (2013.01); *B65G 17/12* (2013.01); *H05K 13/0069* (2013.01)

(58) Field of Classification Search
CPC .......... B65G 1/12; B65G 1/127; B65G 1/133; B65G 17/12; B65G 17/123
USPC .......... 198/345.3, 346.2; 414/222.01, 222.06, 414/222.07, 749.1, 751.1, 752.1
See application file for complete search history.

(56) References Cited

U.S. PATENT DOCUMENTS

| 5,321,885 A * | 6/1994 | Hino et al. ...................... 29/832 |
| 5,491,737 A * | 2/1996 | Yarnall et al. ................... 378/58 |
| 6,035,522 A * | 3/2000 | Larson et al. ................... 29/760 |
| 7,434,675 B1 * | 10/2008 | Rohm et al. ............... 198/346.2 |
| 2002/0069517 A1 * | 6/2002 | Miura et al. ..................... 29/743 |
| 2003/0226251 A1 * | 12/2003 | Mehdianpour et al. ......... 29/739 |
| 2005/0105999 A1 * | 5/2005 | Kappler ...................... 414/789.5 |
| 2006/0048379 A1 * | 3/2006 | Onobori et al. .................. 29/832 |
| 2006/0172569 A1 * | 8/2006 | Shiang ............................ 439/83 |
| 2011/0049875 A1 * | 3/2011 | Stults et al. ................... 285/345 |
| 2012/0266457 A1 * | 10/2012 | Hanamura et al. .............. 29/739 |
| 2013/0168203 A1 * | 7/2013 | Nakajima et al. .......... 198/339.1 |

FOREIGN PATENT DOCUMENTS

TW            361056          6/1999

OTHER PUBLICATIONS

Office action mailed on May 20, 2015 for the Taiwan application No. 102113819, filing date: Apr. 18, 2013, page 1 line 12~14 and page 2 line 1.

* cited by examiner

*Primary Examiner* — Mark A Deuble
(74) *Attorney, Agent, or Firm* — Winston Hsu; Scott Margo

(57) ABSTRACT

An unloading system includes a casing, a conveying device, a capturing device and a control device. A first entrance, a first exit and a second exit are formed on the casing. The conveying device is for conveying a carrying component and a circuit board disposed on the carrying component from the first entrance. The capturing device is for capturing the circuit board and then conveying the circuit board to the first exit. The control device is electrically connected to the conveying device and the capturing device. The control device is for controlling the capturing device to capture the circuit board entering from the first entrance and then to convey the circuit board to the first exit. The control device is further for controlling the conveying device to convey the carrying component from which the circuit board is unloaded to the second exit.

12 Claims, 10 Drawing Sheets

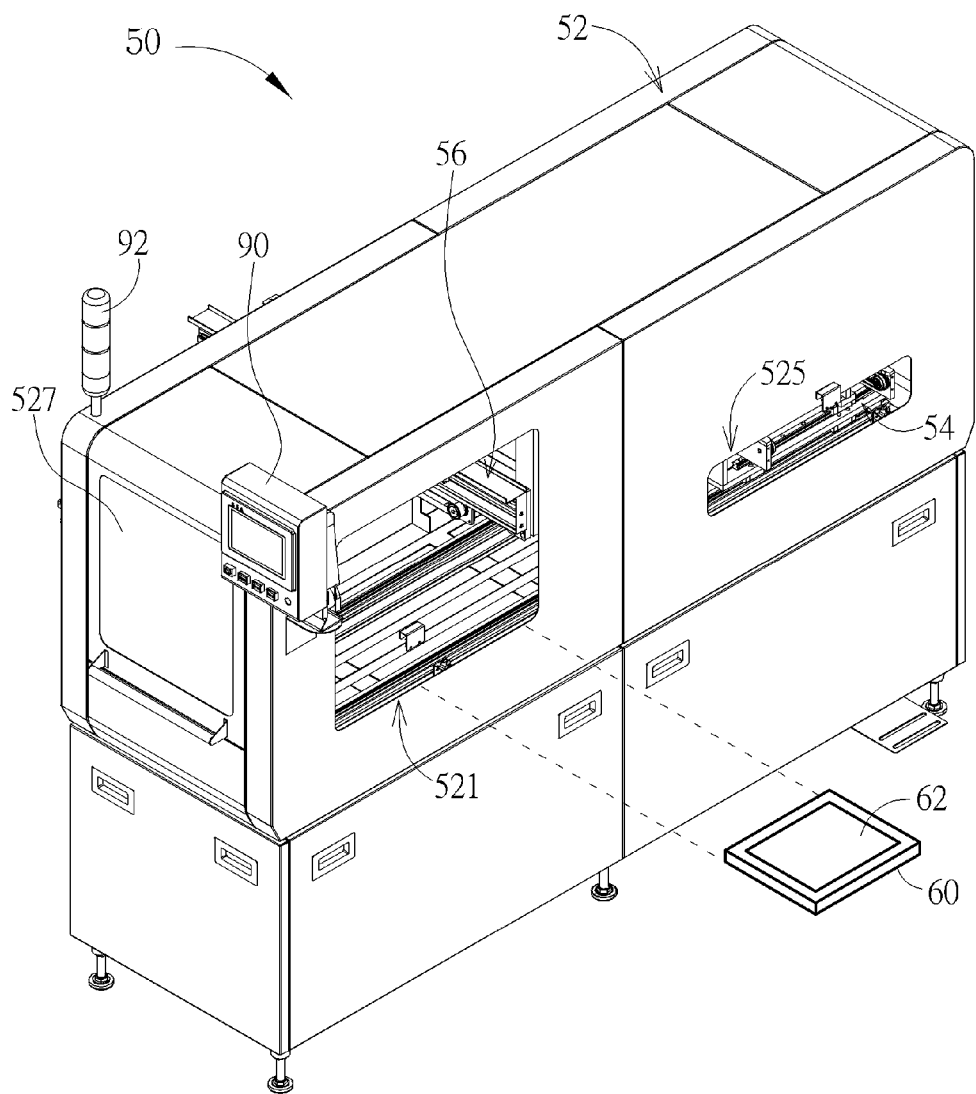
FIG. 3
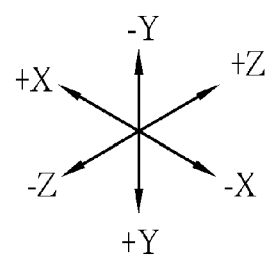

UNLOADING SYSTEM FOR UNLOADING A CIRCUIT BOARD AUTOMATICALLY

BACKGROUND OF THE INVENTION

1. Field of the Invention

The present invention relates to an unloading system, and more specifically, to an unloading system for unloading a circuit board automatically.

2. Description of the Prior Art

In a conventional assembly procedure of a circuit board in the factory, the circuit board is to be placed on a carrying component, which is for supporting the circuit board and protecting electronic components on the circuit board. However, an operator has to unload the circuit board from the carrying component manually and puts the circuit board on a next station after assembling electronic components on the circuit board. Because temperatures of the circuit board and the carrying component are very high after assembly, the circuit board and the carrying component may injury the operator easily. In addition, the gas generated from assembly also injuries the operator. Therefore, it is an important issue to design an unloading system for unloading the circuit board automatically from the carrying component and conveying the circuit board to the next station.

SUMMARY OF THE INVENTION

The present invention is to provide an unloading system for unloading a circuit board automatically to solve above problems.

According to the disclosure, an unloading system includes a casing, a conveying device, a capturing device and a control device. A first entrance, a first exit and a second exit are formed on the casing. The conveying device is for conveying a carrying component and a circuit board disposed on the carrying component from the first entrance. The capturing device is for capturing the circuit board and then conveying the circuit board to the first exit. The control device is electrically connected to the conveying device and the capturing device. The control device is for controlling the capturing device to capture the circuit board entering from the first entrance and then to convey the circuit board to the first exit. The control device is further for controlling the conveying device to convey the carrying component from which the circuit board is unloaded to the second exit.

According to the disclosure, the capturing device includes a guiding rail, a sliding component, a lifting component and a plurality of attaching components. The sliding component is slidably installed on the guiding rail in a first direction. The lifting component is installed on a side of the sliding component in a lifting manner in a second direction. The plurality of attaching components are connected to the lifting component for attaching the circuit board disposed on the carrying component, so as to separate the circuit board from the carrying component.

According to the disclosure, each attaching component includes a supporting portion and an attaching portion. The supporting portion is installed on the lifting component. The attaching portion movably is installed on the supporting portion, so as to adjust the attaching component to attach the circuit board with different sizes on different positions.

According to the disclosure, a sliding slot is formed on the supporting portion, and the attaching portion is slidably installed inside the sliding slot.

According to the disclosure, the capturing device includes a transmission component and a transmission motor. The transmission component is connected to the sliding component, and the transmission component is a chain or a belt. The transmission motor is connected to the transmission component and electrically connected to the control device, and the control device is further for controlling the transmission motor to drive the transmission component to move in the first direction.

According to the disclosure, the unloading system further includes a lifting motor connected to the lifting component and electrically connected to the control device, and the control device being further for controlling the lifting motor to drive the lifting component to move in the second direction.

According to the disclosure, the conveying device includes two linear rails, at least two sliders, a conveying module, a driving component and a driving motor. The at least two sliders are slidably installed on the two linear rails in a third direction respectively. The conveying module is installed on the at least two sliders for conveying the carrying component and the circuit board disposed on the carrying component. The driving component is connected to the conveying module, and the driving component is a chain or a belt. The driving motor is connected to the driving component and electrically connected to the control device, and the control device is further for controlling the driving motor to drive the driving component to move in the third direction, so that the driving component drives the conveying module to move in the third direction.

According to the disclosure, the conveying module includes two adjusting rails, two adjusting sliders, an adjusting component, an adjusting rod and an adjusting motor. The two adjusting sliders are slidably installed on the two adjusting rails in the third direction respectively. The adjusting component is installed on the two adjusting sliders, so as to move relative to the two adjusting rails in the third direction. The adjusting rod passes through the adjusting component. The adjusting motor is connected to the adjusting rod and electrically connected to the control device, and the control device is further for controlling the adjusting motor to drive the adjusting rod, so that the adjusting rod drives the adjusting component to move in the third direction, so as to adjust a width of the conveying module.

According to the disclosure, the conveying module further includes a locating component, a locating gear, a locating rod and a locating motor. The locating component is for locating the carrying component from the first entrance, and the locating component is a chain. The locating gear is connected to the locating component for driving the locating component. The locating rod is connected to the locating gear for driving the locating gear. The locating motor is connected to the locating rod and electrically connected to the control device, and the control device is further for controlling the locating motor to drive the locating rod and the locating gear, so that the locating component locates the carrying component.

According to the disclosure, two block components are respectively disposed on two sides of each linear rail, and the two block components are for constraining movement of the conveying module on each linear rail.

According to the disclosure, the unloading system further includes a human-computer interface electrically connected to the control device for inputting control commands into the control device.

According to the disclosure, the unloading system further includes an alert unit electrically connected to the control device, the casing comprising a door, and the control device being further for controlling the alert unit to generate an alert message as the door is opened.

The unloading system of the present invention captures the circuit board disposed on the carrying component entering from the first entrance, and then conveys the circuit board to the first exit. In addition, the control device controls the conveying device to convey the carrying component from which the circuit board is unloaded to the second exit, so as to achieve the purpose of unloading the circuit board automatically. Therefore, it can solve the conventional problem that the operator has to unload the circuit board from the carrying component manually after assembling electronic components on the circuit board, resulting in injuring the operator due to high temperatures of the circuit board and the carrying component or harmful gases.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 and FIG. 3 are diagrams of the unloading system in different views according to the embodiment of the present invention.

DETAILED DESCRIPTION

Figure 1:
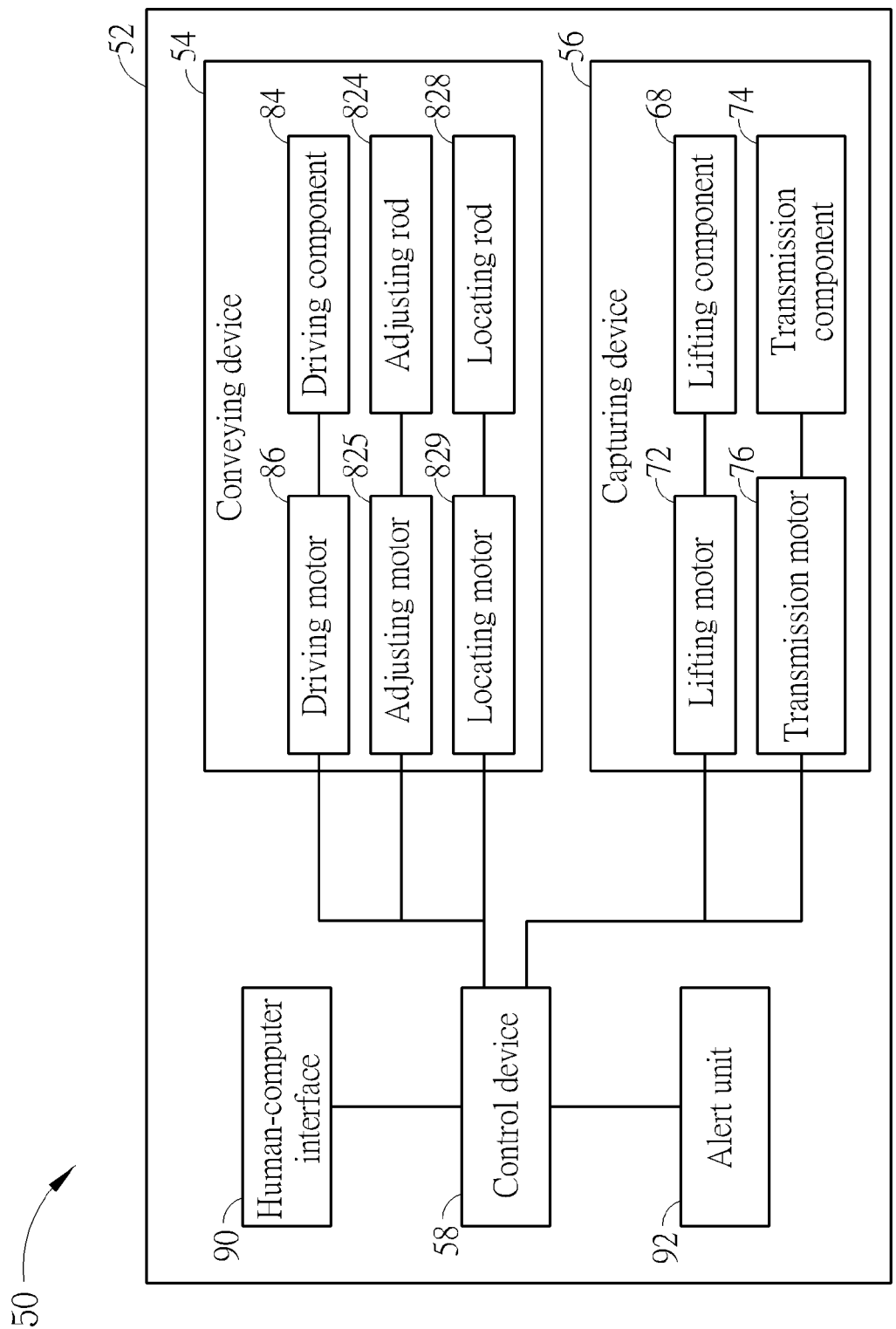
FIG. 1 is a functional block diagram of an unloading system according to an embodiment of the present invention.
Figure 2:
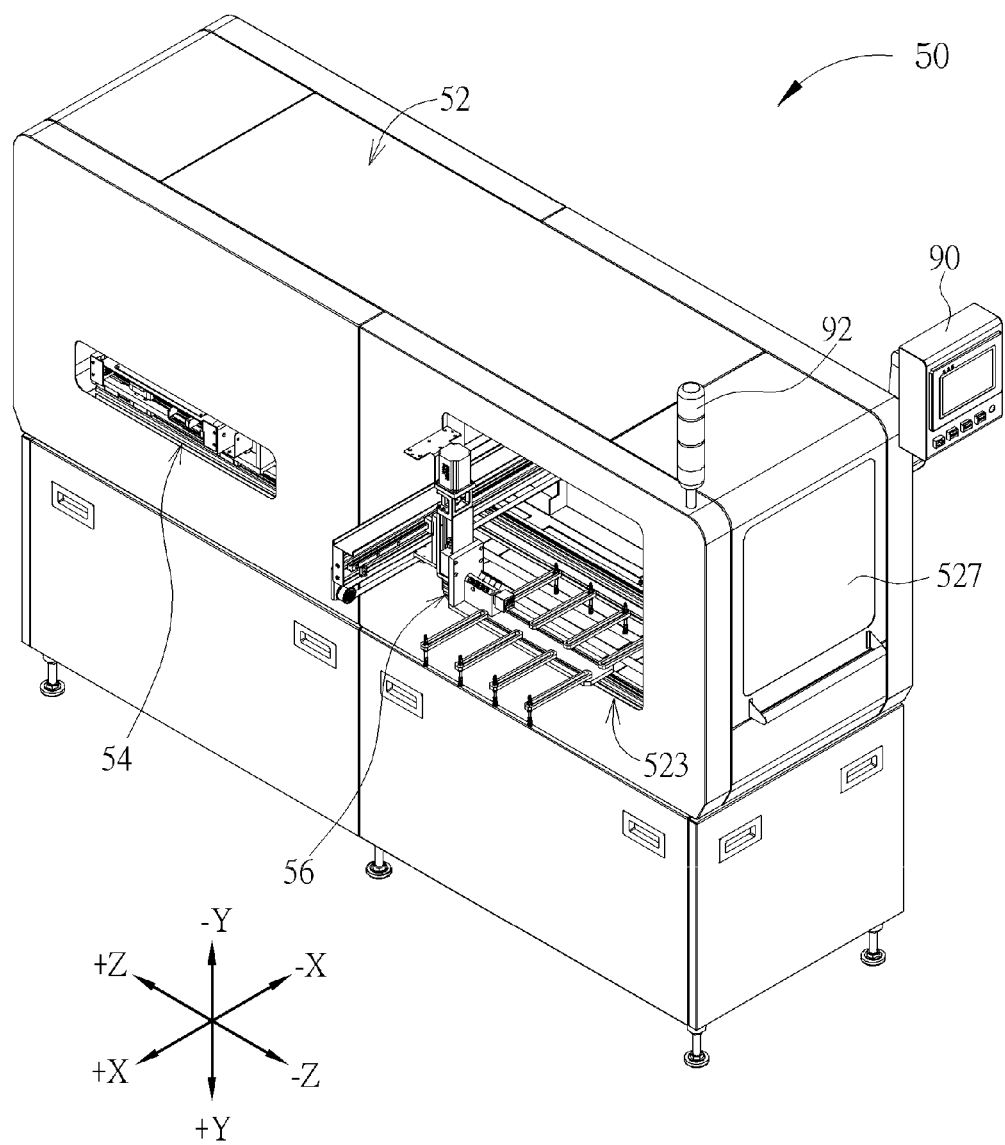
Figure 4:
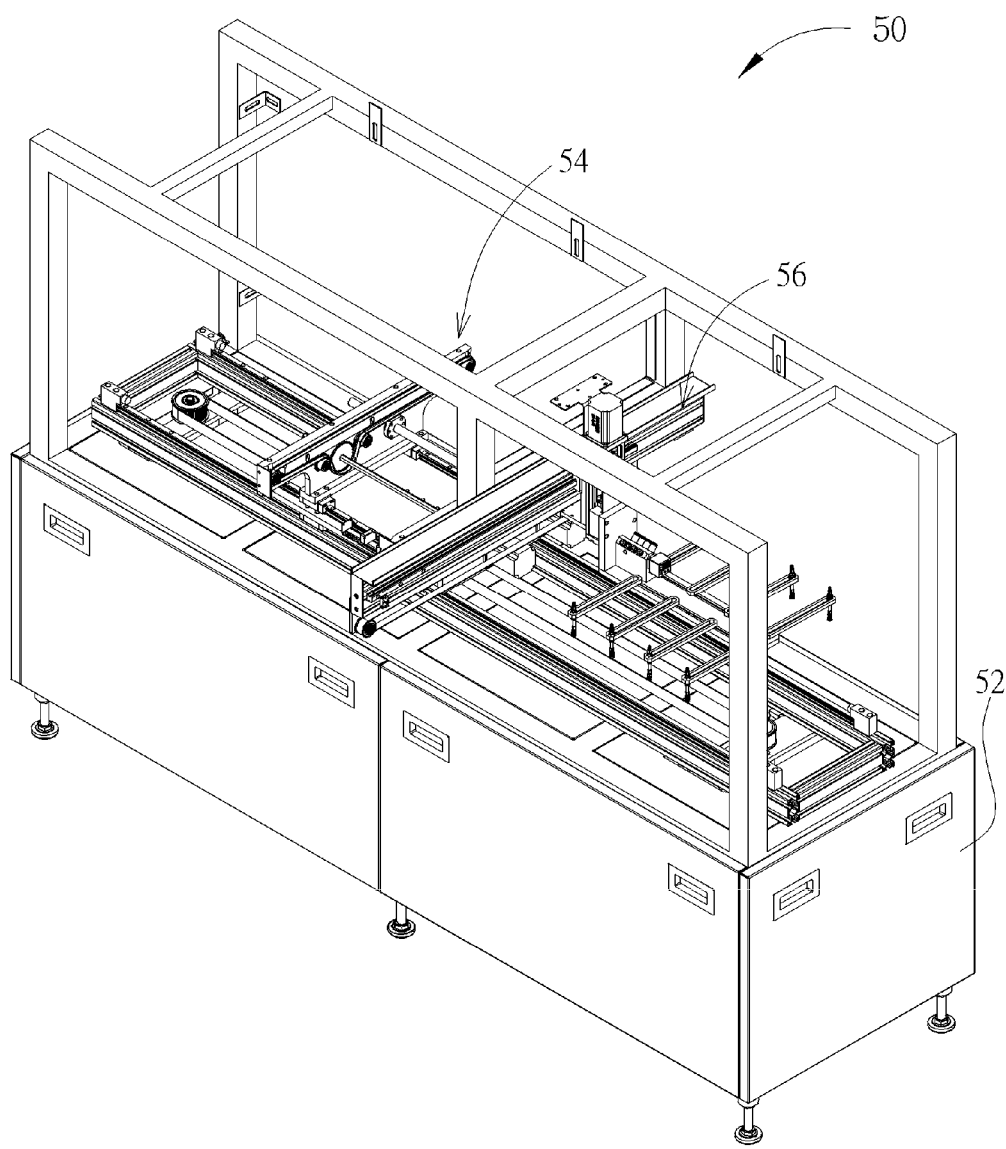
FIG. 4 is an inner structural diagram of the unloading system according to the embodiment of the present invention.

Please refer to FIG. 1 to FIG. 4. FIG. 1 is a functional block diagram of an unloading system 50 according to an embodiment of the present invention. FIG. 2 and FIG. 3 are diagrams of the unloading system 50 in different views according to the embodiment of the present invention. FIG. 4 is an inner structural diagram of the unloading system 50 according to the embodiment of the present invention. The unloading system 50 of the present invention includes a casing 52, a conveying device 54, a capturing device 56 and a control device 58. A first entrance 521, a first exit 523 and a second exit 525 are formed on the casing 52. The conveying device 54 is installed inside the casing 52 for conveying a carrying component 60 and a circuit board 62 disposed on the carrying component 60 from the first entrance 521. The carrying component 60 can be a tool for supporting the circuit board 62. The first entrance 521 of the unloading system 50 can be connected to a conveyor (not shown in figures), such as a conveying belt, for conveying the carrying component 60 and the processed circuit board 62 from a previous station (not shown in figures) to the first entrance 521. The capturing device 56 is installed inside the casing 52 for capturing the circuit board 62 disposed on the carrying component 60 and then conveying the circuit board 62 to the first exit 523, so as to convey the circuit board 62 to a next station. The control device 58 is electrically connected to the conveying device 54 and the capturing device 56 for controlling the capturing device 56 to capture the circuit board 62 disposed on the carrying component 60 entering from the first entrance 521 and then to convey the circuit board 62 to the first exit 523, and the control device 58 is further for controlling the conveying device 54 to convey the carrying component 60, from which the circuit board 62 is unloaded, to the second exit 525, so as to achieve a purpose of unloading the circuit board 62 automatically.

Figure 5:
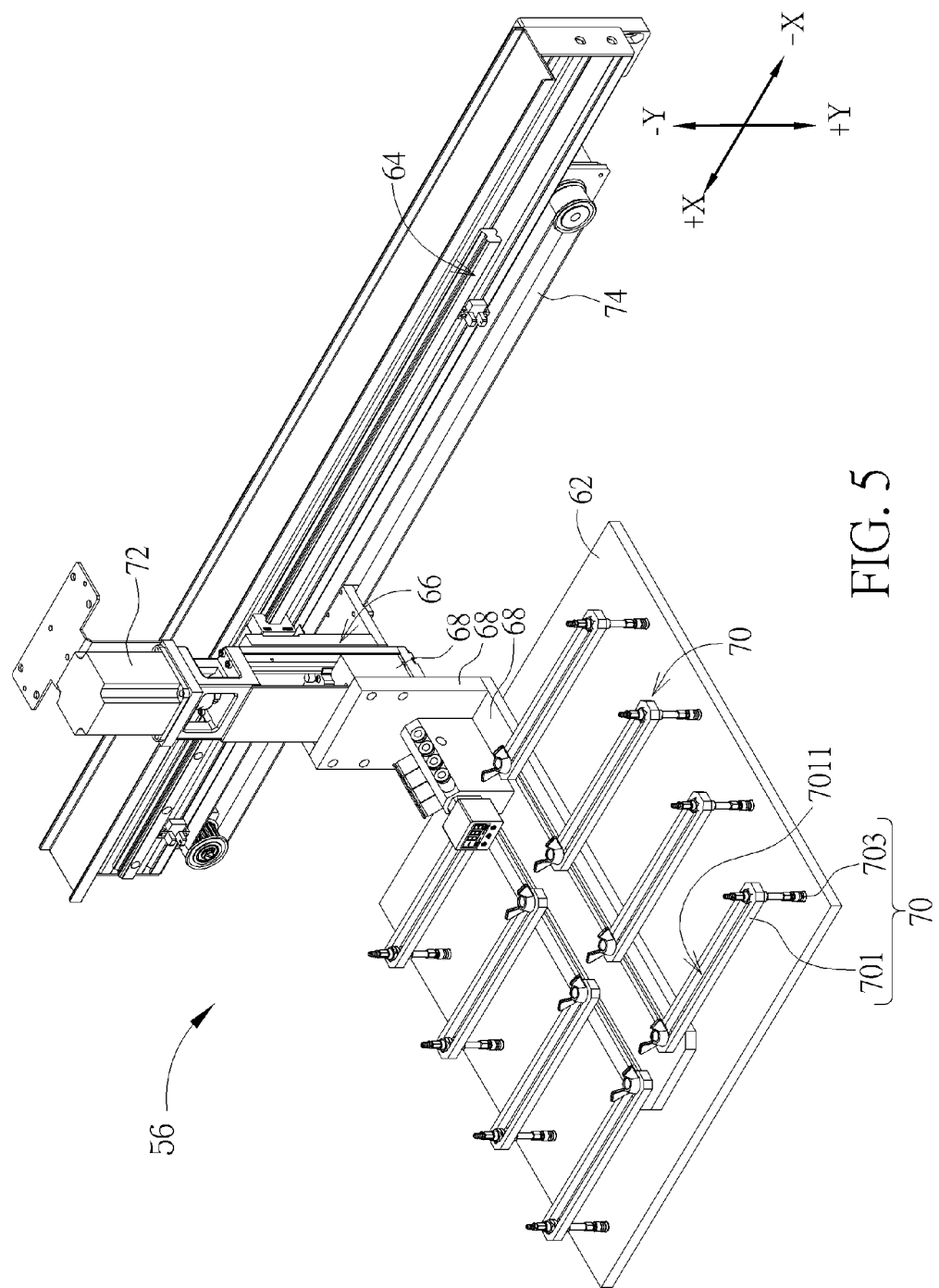
FIG. 5 is a diagram of a capturing device according to the embodiment of the present invention.
Figure 6:
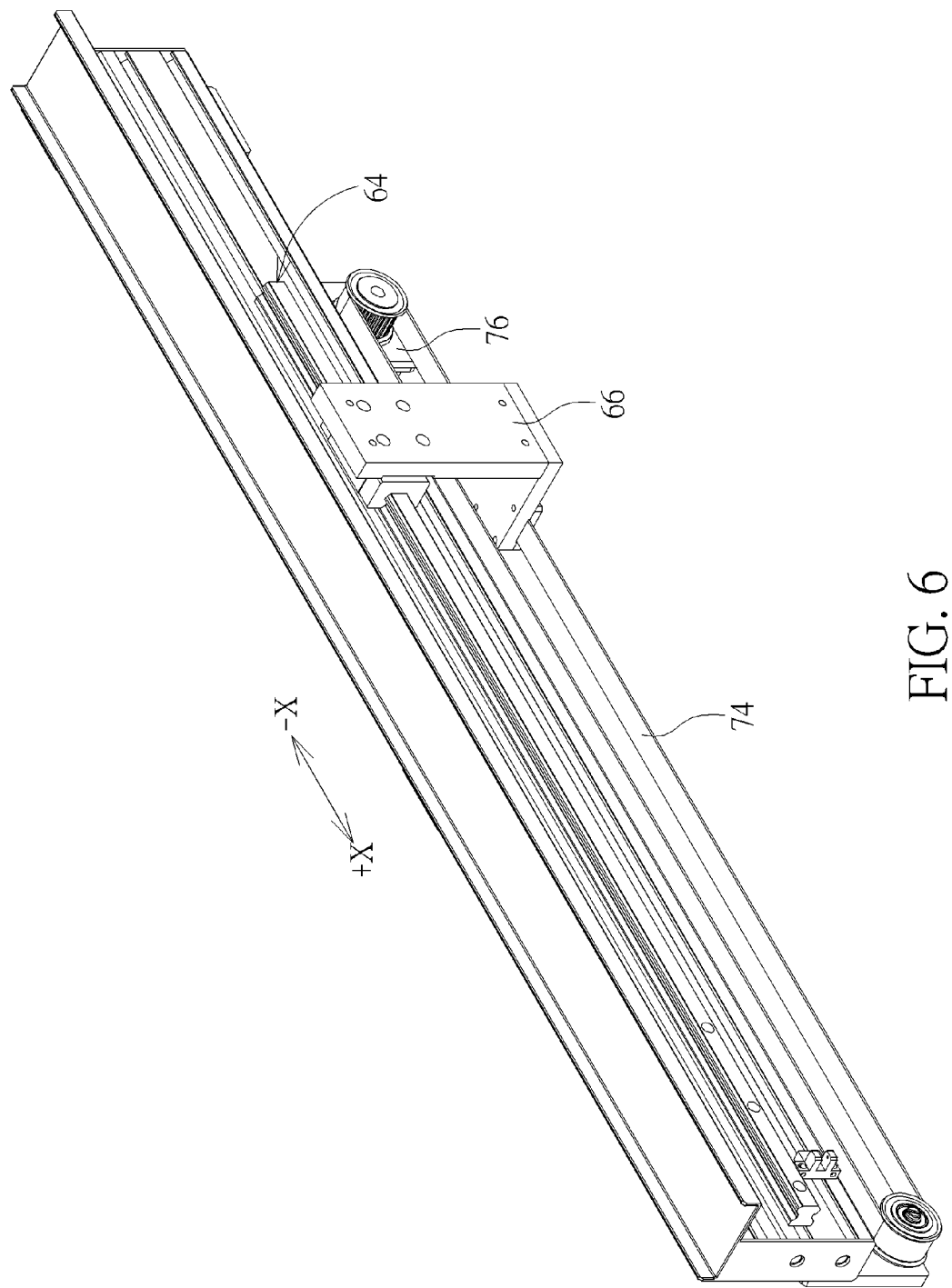
FIG. 6 is a partial diagram of the capturing device according to the embodiment of the present invention.
Figure 7:
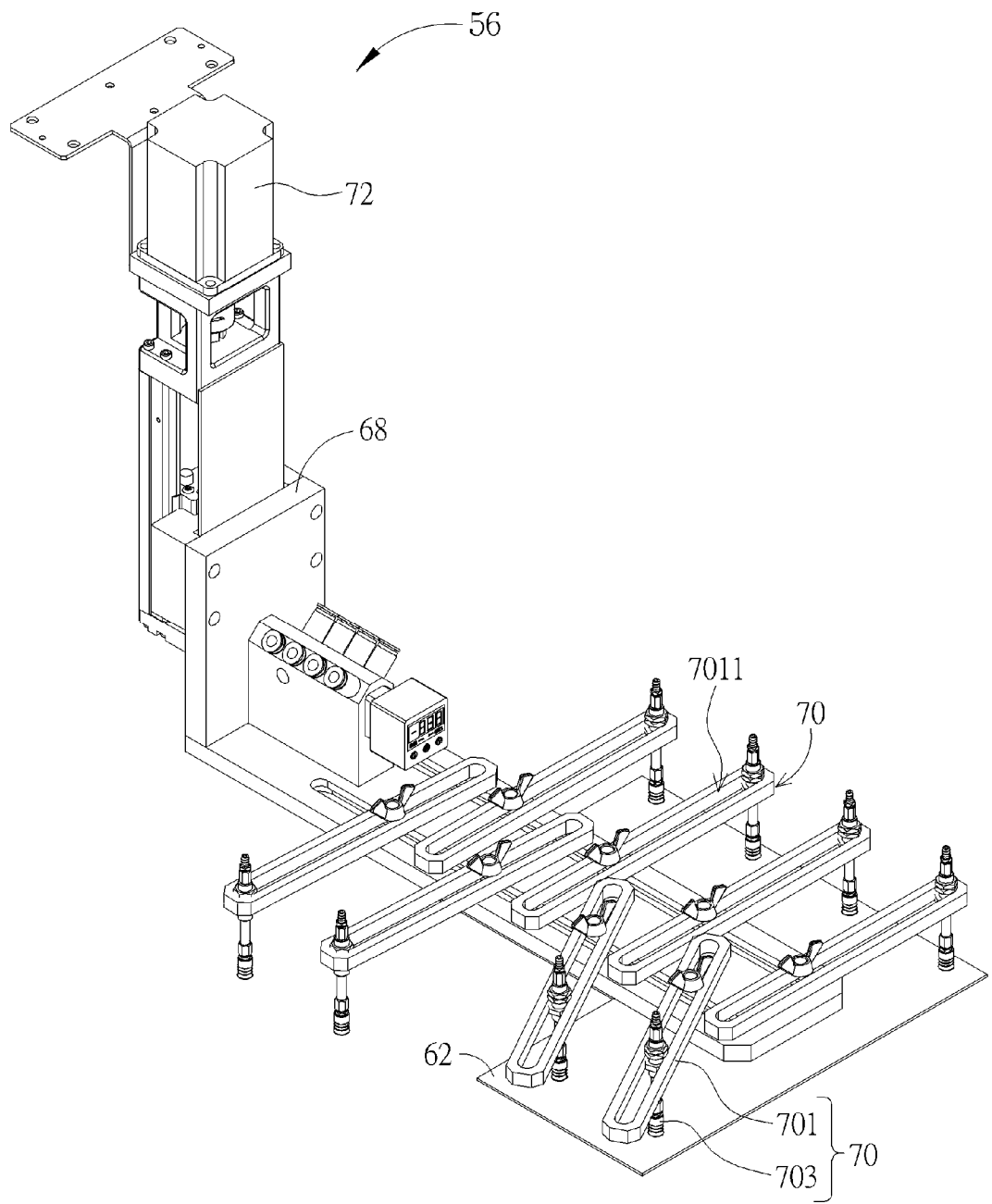
FIG. 7 is a diagram illustrating that the capturing device captures another circuit board according to the embodiment of the present invention.

Please refer to FIG. 1 and FIG. 5 to FIG. 7. FIG. 5 is a diagram of the capturing device 56 according to the embodiment of the present invention. FIG. 6 is a partial diagram of the capturing device 56 according to the embodiment of the present invention. FIG. 7 is a diagram illustrating that the capturing device 56 captures another circuit board 62 according to the embodiment of the present invention. The capturing device 56 includes a guiding rail 64, a sliding component 66, a lifting component 68 and a plurality of attaching components 70. The sliding component 66 is slidably installed on the guiding rail 64 in a first direction (+X direction). The lifting component 68 is installed on a side of the sliding component 66 in a lifting manner in a second direction (+Y direction). The plurality of attaching components 70 is connected to the lifting component 68 for attaching the circuit board 62 disposed on the carrying component 60, so as to separate the circuit board 62 from the carrying component 60 shown in FIG. 3.

Each attaching component 70 includes a supporting portion 701 and an attaching portion 703. The supporting portion 701 is installed on the lifting component 68, and the attaching portion 703 is movably installed on the supporting portion 701, so as to adjust the attaching component 70 to attach the circuit board 62 with different sizes on different positions. A sliding slot 7011 is formed on the supporting portion 701, and the attaching portion 703 is slidably installed inside the sliding slot 7011. For example, as shown in FIG. 7, the capturing device 56 can capture the circuit board 62 with different sizes by adjusting a position of the attaching portion 703 inside the sliding slot 7011 or rotating the supporting portion 701. For example, the capturing device 56 can capture the circuit board 62 with another size illustrated in FIG. 7. The unloading system 50 further includes a lifting motor 72 connected to the lifting component 68 and electrically connected to the control device 58. The control device 58 is further for controlling the lifting motor 72 to drive the lifting component 68 to move in the second direction (+Y direction). In addition, as shown in FIG. 6, the capturing device 56 further includes a transmission component 74 and a transmission motor 76. The transmission component 74 is connected to the sliding component 66, and the transmission motor 76 is connected to the transmission component 74 and electrically connected to the control device 58. The control device 58 is further for controlling the transmission motor 76 to drive the transmission component 74, so that the transmission component 74 drives the sliding component 66 to move in the first direction (+X direction). The transmission component 74 can be a chain or a belt, but is not limited to it.

Figure 8:
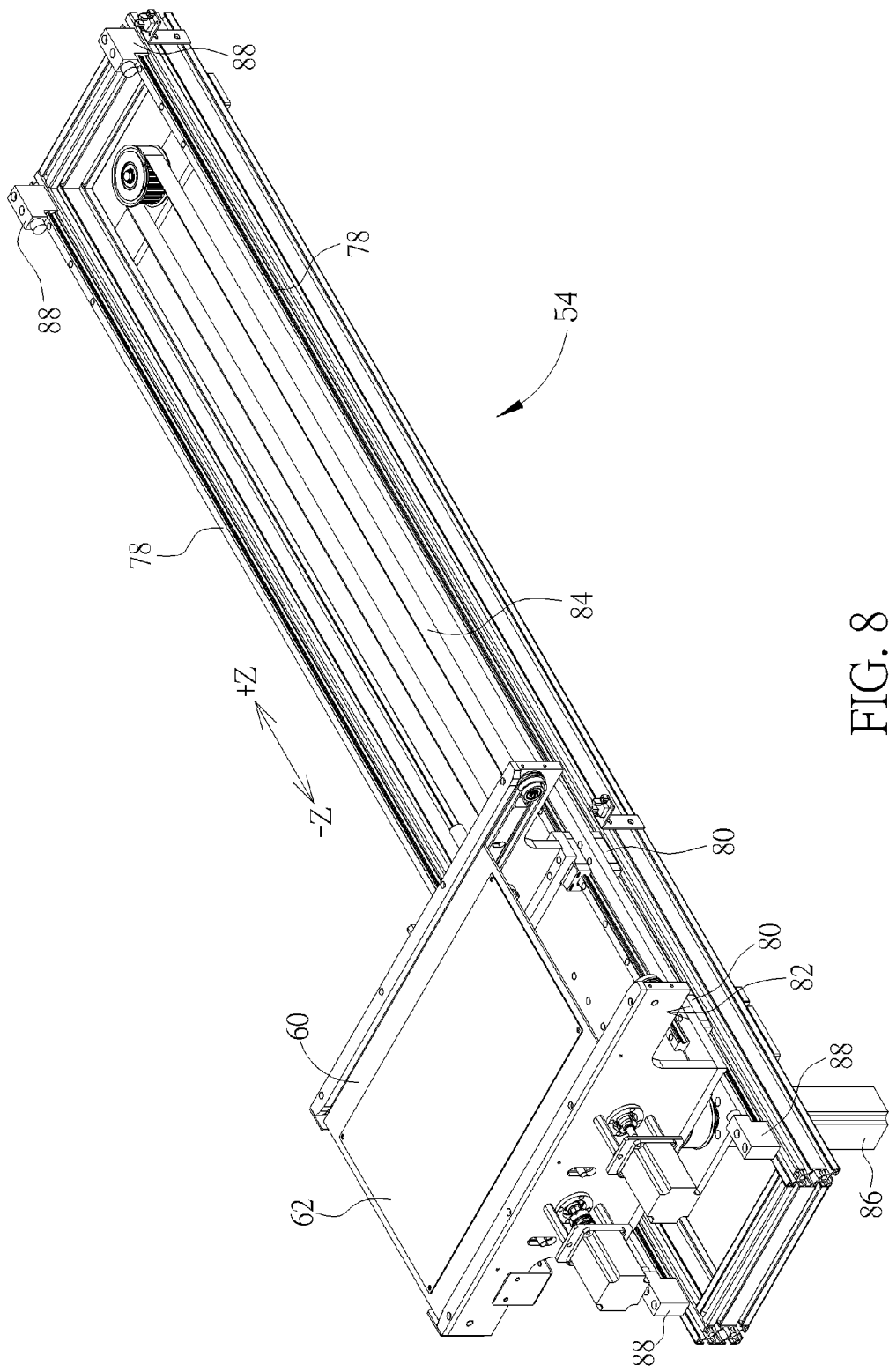
FIG. 8 is a diagram of a conveying device according to the embodiment of the present invention.
Figure 9:
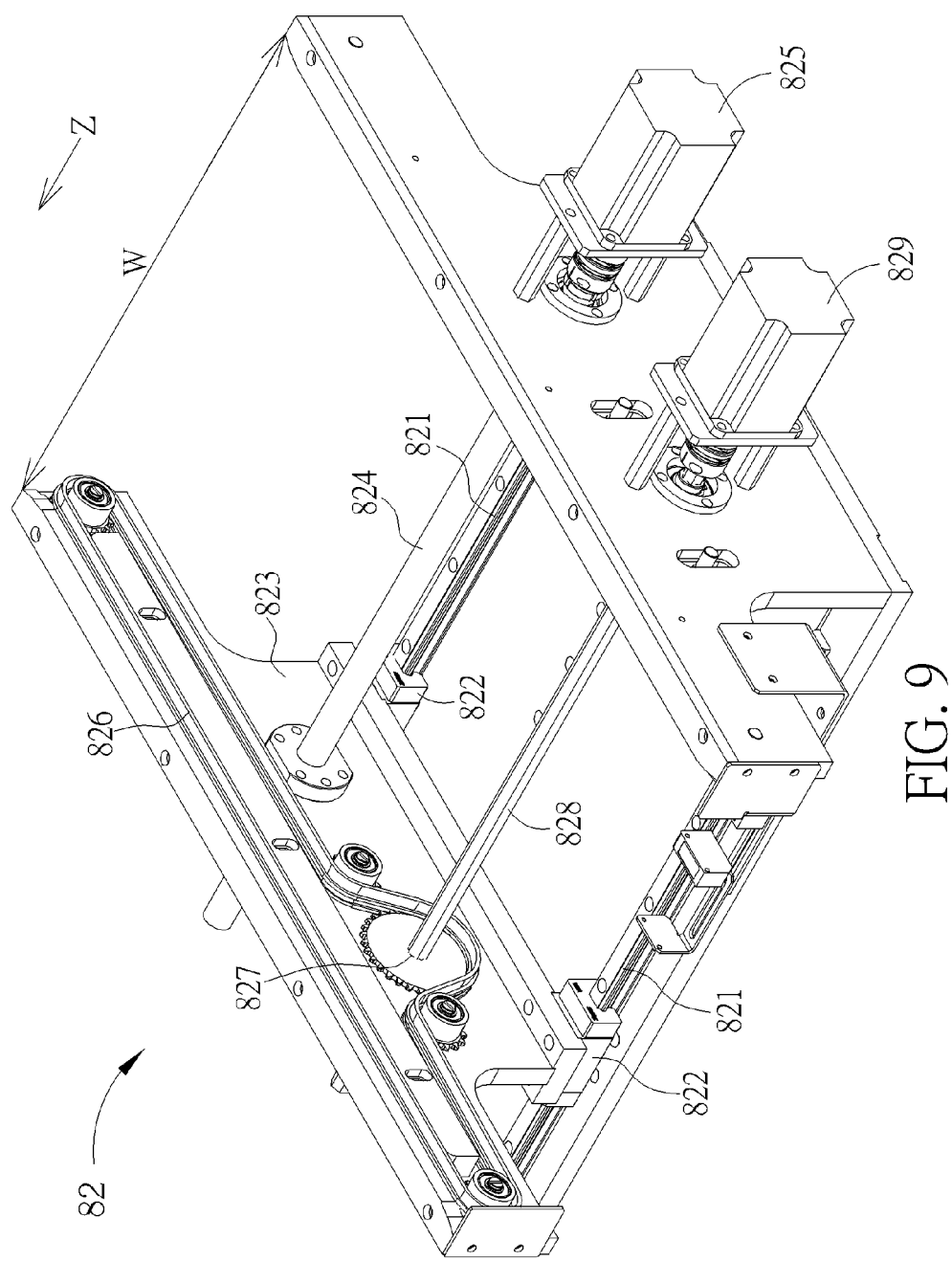
FIG. 9 and FIG. 10 are partial diagrams of the conveying device according to the embodiment of the present invention.
Figure 10:
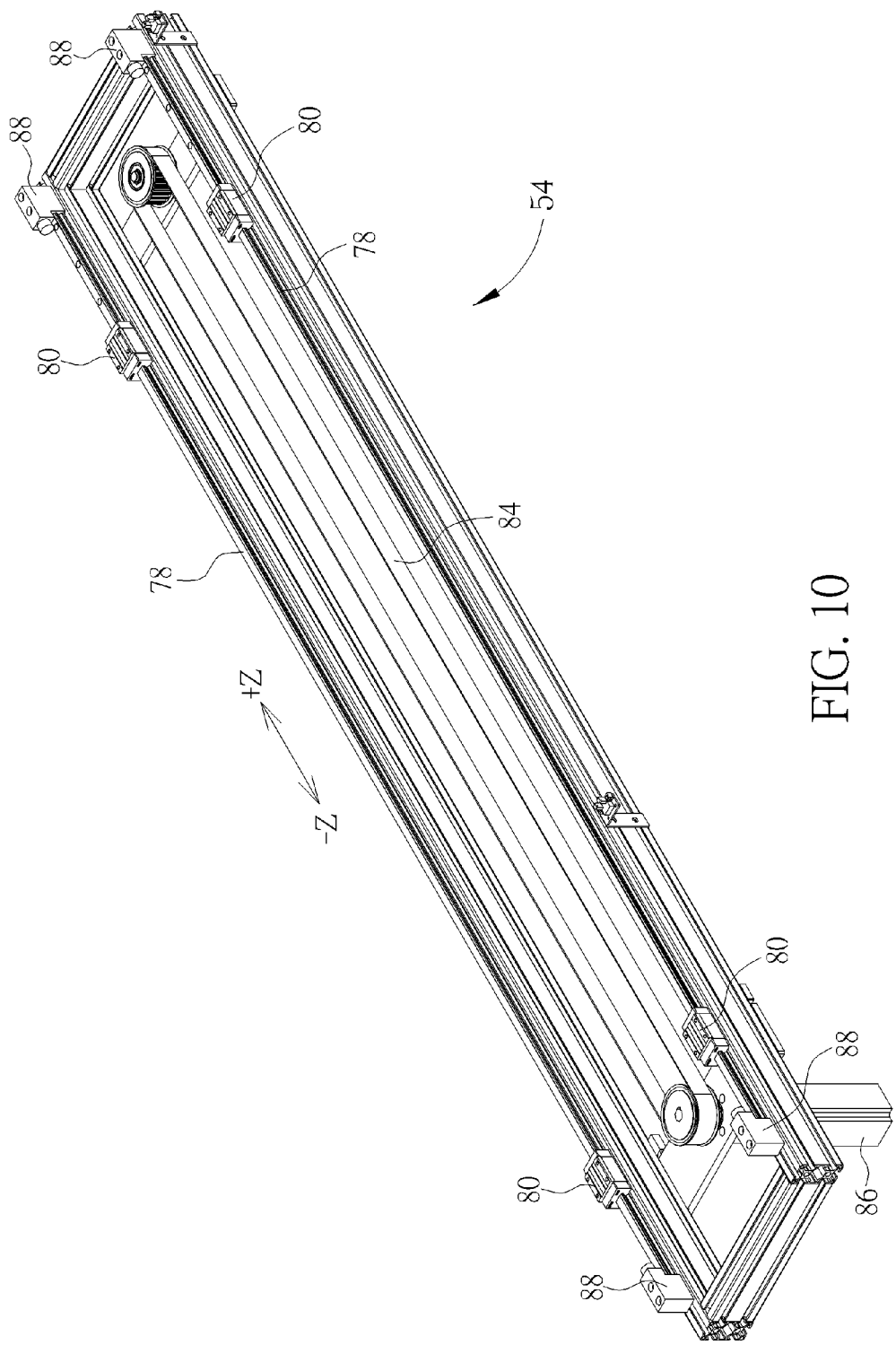

Please refer to FIG. 1, FIG. 3 and FIG. 8 to FIG. 10. FIG. 8 is a diagram of the conveying device 54 according to the embodiment of the present invention. FIG. 9 and FIG. 10 are partial diagrams of the conveying device 54 according to the embodiment of the present invention. The conveying device 54 includes two linear rails 78, at least two sliders 80, a conveying module 82, a driving component 84 and a driving motor 86. The at least two sliders 80 are slidably installed on the two linear rails 78 in a third direction (+Z direction) respectively. In this embodiment, the conveying device 54 includes four sliders 80, and the conveying module 82 is installed on the four sliders 80. For example, the four sliders 80 can be disposed on four corners of the conveying module 82. The conveying module 82 is for conveying the carrying component 60 and the circuit board 62 disposed on the carrying component 60. The driving component 84 is connected to the conveying module 82, and the driving motor 86 is connected to the driving component 84 and electrically connected to the control device 58. The control device 58 is further for controlling the driving motor 86 to drive the driving component 84 to move in the third direction (+Z direction), so that the driving component 84 drives the conveying module 82 to move in the third direction (+Z direction). The driving component 84 can be a chain or a belt, but is not limited to it. Furthermore, two block components 88 are disposed on two sides of each linear rail 78 respectively, and the two block components 88 are for constraining movement of the conveying module 82 on each linear rail 78. In this embodiment, the conveying device 54 includes four block components 88.

Moreover, the conveying module 82 includes two adjusting rails 821, two adjusting sliders 822, an adjusting component 823, an adjusting rod 824 and an adjusting motor 825. The two adjusting sliders 822 are slidably installed on the two adjusting rails 821 in the third direction (+Z direction) respectively. The adjusting component 823 is installed on the two adjusting sliders 822, so as to move relative to the two adjusting rails 821 in the third direction (+Z direction). The adjusting rod 824 passes through the adjusting component 823, and the adjusting motor 825 is connected to the adjusting rod 824 and electrically connected to the control device 58. The control device 58 is further for controlling the adjusting motor 825 to drive the adjusting rod 824, so that the adjusting rod 824 drives the adjusting component 823 to move in the third direction (+Z direction), so as to adjust a width W of the conveying module 82 to support the circuit board 62 with different sizes. The adjusting rod 824 can be a ball screw capable of converting rotary motion to linear motion.

In addition, the conveying module 82 further includes a locating component 826, a locating gear 827, a locating rod 828 and a locating motor 829. The locating component 826 is for locating the carrying component 60 from the first entrance 521. The locating gear 827 is connected to the locating component 826 for driving the locating component 826. The locating rod 828 is connected to the locating gear 827 for driving the locating gear 827. The locating motor 829 is connected to the locating rod 828 and electrically connected to the control device 58. The control device 58 is further for controlling the locating motor 829 to drive the locating rod 828 and the locating gear 827, so that the locating component 826 locates the carrying component 60. That is, after the carrying component 60 and the circuit board 62 are conveyed into the first entrance 521, the locating component 826 locates the carrying component 60, so that the capturing device 56 can capture the circuit board 62 disposed on the carrying component 60 correctly. The locating component 826 can be a chain, but is not limited to it.

A procedure of the unloading system 50 unloading the circuit board 62 is described as follows. Please refer to FIG. 1 to FIG. 10. First, the conveyor (not shown in figures) which is connected to the first entrance 521 conveys the carrying component 60 and the circuit board 62 to the first entrance 521. Then, the control device 58 controls the locating motor 829 to drive the locating rod 828 and the locating gear 827, so that the locating component 826 locates the carrying component 60. After that, the control device 58 controls the lifting motor 72 to drive the lifting component 68 to move in the second direction (+Y direction), so that the plurality of the attaching components 70 attaches the circuit board 62. After the plurality of the attaching components 70 attaches the circuit board 62, the control device 58 controls the lifting motor 72 to drive the lifting component 68 to move in a direction (−Y direction) opposite to the second direction (+Y direction), and controls the transmission motor 76 to drive the transmission component 74, so that the sliding component 66 and the lifting component 68 move in the first direction (+X direction). Then, the control device 58 controls the lifting motor 72 again to drive the lifting component 68 to move in the second direction (+Y direction) to put the circuit board 62 on the conveyor connected to the first exit 523, so that the circuit board 62 is conveyed to the next station along the conveyor in the first direction (+X direction).

Finally, the control device 58 controls the transmission motor 76 to drive the transmission component 74 again, so that the sliding component 66 and the lifting component 68 move in a direction (−X direction) opposite to the first direction (+X direction) to an initial position. Furthermore, as the plurality of the attaching components 70 attaches the circuit board 62 and the lifting component 68 moves in the direction (−Y direction) opposite to the second direction (+Y direction), the control device 58 controls the driving motor 86 to drive the driving component 84 to move in the third direction (+Z direction), so that the driving component 84 drives the conveying module 82 to move in the third direction (+Z direction) to the second exit 525. Then, the control device 58 controls the locating motor 829 to drive the locating rod 828 and the locating gear 827, so that the locating component 826 drives the carrying component 60 to another conveyor (not shown in figures) which is connected to the second exit 525. Therefore, the carrying component 60 is conveyed to the previous station, not shown in figures, in the direction (−X direction) opposite to the first direction (+X direction). Finally, the control device 58 controls the driving motor 86 to drive the driving component 84 to move in a direction (−Z direction) opposite to the third direction (+Z direction), so that the driving component 84 drives the conveying module 82 to move in the direction (−Z direction) opposite to the third direction (+Z direction) to an initial position.

Moreover, please refer to FIG. 1 to FIG. 3. The unloading system of the present invention further includes a human-computer interface 90 electrically connected to the control device 58. The human-computer interface 90 is for an operator to input control commands into the control device 58, so as to meet requirements of factory procedures. In addition, the unloading system 50 further includes an alert unit 92 electrically connected to the control device 58, and the casing 52 includes a door 527. The control device 58 is further for controlling the alert unit 92 to generate an alert message as the door 527 is opened. For example, as the operator opens the door 527, the control device 58 controls the alert unit 92 to generate the alert message and stops operation of the conveying device 54 and the capturing device 56 to prevent the operator from injury. The alert unit 92 can be a light-emitting component, a buzzer, and so on. The alert unit 92 is for generating warning light or alert sound accordingly.

In contrast to the prior art, the unloading system of the present invention captures the circuit board disposed on the carrying component entering from the first entrance, and then conveys the circuit board to the first exit. In addition, the control device controls the conveying device to convey the carrying component from which the circuit board is unloaded to the second exit, so as to achieve the purpose of unloading the circuit board automatically. Therefore, it can solve the conventional problem that the operator has to unload the circuit board from the carrying component manually after assembling electronic components on the circuit board, resulting in injuring the operator due to high temperatures of the circuit board and the carrying component or harmful gases.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An unloading system for unloading a circuit board, the unloading system, comprising:
    a casing whereon a first entrance, a first exit and a second exit are formed;
    a conveying device installed inside the casing for conveying a carrying component and a circuit board disposed on the carrying component from the first entrance;
    a capturing device installed inside the casing for capturing the circuit board disposed on the carrying component and then conveying the circuit board to the first exit; and
    a control device electrically connected to the conveying device and the capturing device for controlling the capturing device to capture the circuit board entering from the first entrance and then conveying the circuit board to the first exit, and the control device being further for controlling the conveying device to convey the carrying component from which the circuit board is unloaded to the second exit.

2. The unloading system of claim 1, wherein the capturing device comprises:
    a guiding rail;
    a sliding component slidably installed on the guiding rail in a first direction;
    a lifting component installed on a side of the sliding component in a lifting manner in a second direction; and
    a plurality of attaching components connected to the lifting component for attaching the circuit board disposed on the carrying component, so as to separate the circuit board from the carrying component.

3. The unloading system of claim 2, wherein each attaching component comprises:
    a supporting portion installed on the lifting component; and
    an attaching portion movably installed on the supporting portion, so as to adjust the attaching component to attach the circuit board with different sizes on different positions.

4. The unloading system of claim 3, wherein a sliding slot is formed on the supporting portion, and the attaching portion is slidably installed inside the sliding slot.

5. The unloading system of claim 2, wherein the capturing device further comprises:
    a transmission component connected to the sliding component, the transmission component being a chain or a belt; and
    a transmission motor connected to the transmission component and electrically connected to the control device, and the control device being further for controlling the transmission motor to drive the transmission component to move in the first direction.

6. The unloading system of claim 2, further comprising a lifting motor connected to the lifting component and electrically connected to the control device, and the control device being further for controlling the lifting motor to drive the lifting component to move in the second direction.

7. The unloading system of claim 2, wherein the conveying device comprises:
    two linear rails;
    at least two sliders slidably installed on the two linear rails in a third direction respectively;
    a conveying module installed on the at least two sliders for conveying the carrying component and the circuit board disposed on the carrying component;
    a driving component connected to the conveying module, the driving component being a chain or belt; and
    a driving motor connected to the driving component and electrically connected to the control device, and the control device being further for controlling the driving motor to drive the driving component to move in the third direction, so that the driving component drives the conveying module to move in the third direction.

8. The unloading system of claim 7, wherein the conveying module comprises:
    two adjusting rails;
    two adjusting sliders slidably installed on the two adjusting rails in the third direction respectively;
    an adjusting component installed on the two adjusting sliders, so as to move relative to the two adjusting rails in the third direction;
    an adjusting rod passing through the adjusting component; and
    an adjusting motor connected to the adjusting rod and electrically connected to the control device, and the control device being further for controlling the adjusting motor to drive the adjusting rod, so that the adjusting rod drives the adjusting component to move in the third direction, so as to adjust a width of the conveying module.

9. The unloading system of claim 7, wherein the conveying module further comprises:
    a locating component for locating the carrying component from the first entrance, the locating component being a chain;
    a locating gear connected to the locating component for driving the locating component;
    a locating rod connected to the locating gear for driving the locating gear; and
    a locating motor connected to the locating rod and electrically connected to the control device, and the control device being further for controlling the locating motor to drive the locating rod and the locating gear, so that the locating component locates the carrying component.

10. The unloading system of claim 7, wherein two block components are respectively disposed on two sides of each linear rail, and the two block components are for constraining movement of the conveying module on each linear rail.

11. The unloading system of claim 1, further comprising a human-computer interface electrically connected to the control device for inputting control commands into the control device.

12. The unloading system of claim 1, further comprises an alert unit electrically connected to the control device, the casing comprising a door, and the control device being further for controlling the alert unit to generate an alert message as the door is opened.

* * * * *